(12) United States Patent
Kuo et al.

(10) Patent No.: US 7,888,668 B2
(45) Date of Patent: Feb. 15, 2011

(54) PHASE CHANGE MEMORY

(75) Inventors: Chien-Li Kuo, Hsinchu (TW); Kuei-Sheng Wu, Tainan County (TW); Yung-Chang Lin, Tai-Chung Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 330 days.

(21) Appl. No.: 12/174,642

(22) Filed: Jul. 17, 2008

(65) Prior Publication Data

US 2010/0012916 A1    Jan. 21, 2010

(51) Int. Cl.
*H01L 47/00* (2006.01)
*H01L 21/82* (2006.01)
*G11C 11/00* (2006.01)

(52) U.S. Cl. .............. 257/4; 257/E21.64; 257/E21.004; 257/E27.004; 438/129; 365/163

(58) Field of Classification Search ............... 257/3, 257/4, E27.081, E21.645, 1, 5, E21.004, 257/E27.004; 438/34, 102, 240, 129; 365/148, 365/163, 225.7
See application file for complete search history.

(56) References Cited

U.S. PATENT DOCUMENTS

| | | | |
|---|---|---|---|
| 5,714,768 | A | 2/1998 | Ovshinsky et al. |
| 6,838,692 | B1 | 1/2005 | Lung |
| 2003/0189200 | A1* | 10/2003 | Lee et al. ............ 257/1 |
| 2004/0190360 | A1* | 9/2004 | Scheuerlein ........ 365/225.7 |
| 2006/0157683 | A1* | 7/2006 | Scheuerlein ........ 257/4 |
| 2009/0003032 | A1* | 1/2009 | Philipp et al. ...... 365/148 |

* cited by examiner

*Primary Examiner*—Thomas L Dickey
*Assistant Examiner*—Nikolay Yushin
(74) *Attorney, Agent, or Firm*—Winston Hsu; Scott Margo (57) ABSTRACT

A phase change memory and the method for manufacturing the same are disclosed. The phase change memory includes a word line, a phase change element, a plurality of heating parts, and a plurality of bit lines. The phase change material layer is electrically connected to the word line and the heating parts. Each heating part is electrically connected to a respective bit line.

17 Claims, 12 Drawing Sheets

PHASE CHANGE MEMORY

BACKGROUND OF THE INVENTION

1. Field of the Invention

The present invention is related to a phase change memory, and particularly, to a phase change memory having a plurality of heating parts electrically connected to a plurality of corresponding bit lines.

2. Description of the Prior Art

Memory is a growing industry that follows the trend of the electronic devices to store more data and to work efficiently. In the past days, memory only stored few data. However, the modern memory is utilized to store music or media data of at least one gigabyte. Therefore, memory having larger capacity for storing more data is required.

Depending on storage capacity and the relationship with power, memories may be divided into two types, volatile memory and non-volatile memory. The volatile memory loses the stored information when the power is turned off. The most common form of volatile memory is dynamic random access memory (DRAM). The non-volatile memory does not lose its information when the power is turned off. The information may be read again when the power is regained. The most common form of non-volatile memory is Flash memory. Both DRAM and Flash memory are programmed by electron flow and erased by removing electrons.

In the past few years, a phase change random access memory, also know as phase change memory, having different work mechanism from DRAM or Flash memory is developed. In contrast to present non-volatile memories, the phase change memory has better performance of reading and writing speed and has a longer lifespan. In addition, the phase change memory is much smaller and is easier to be incorporated with other electrical devices. Therefore, the phase change memory is a significant component of next generation microcontrollers in built-in application systems, such as information device systems, household supplies, car supplies, and control systems, for data programming and storage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

It is therefore a primary objective of the present invention is to provide a high-density phase change memory and the method of manufacturing the same.

The present invention provides a phase change memory unit. The phase change memory unit has a word line, a phase change element electrically connected to the word line, a plurality of bit lines, and a plurality of heating parts electrically connected to the phase change element. In addition, each of the heating parts is electrically connected to a corresponding bit line.

A method for manufacturing the phase change memory unit of the present invention is also disclosed. Initially, a semiconductor substrate having at least a MOS transistor, a first dielectric layer, and a contact plug disposed in the first dielectric layer is provided. The contact plug is used as a lower electrode of the phase change memory unit and is electrically connected to a source/drain of the MOS transistor. A second dielectric layer is formed on the first dielectric layer. A patterned heating layer is formed on the second dielectric layer to define a plurality of heating elements. A third dielectric layer is formed covering the heating elements. A phase change element is formed to be embedded in the second dielectric layer and the third dielectric layer. The phase change element is electrically connected to the patterned glue layer. A fourth dielectric layer is formed covering the phase change element and the third dielectric layer. A plurality of side heating contacts is formed embedded in the third dielectric layer and the fourth dielectric layer. The side heating contacts are positioned around the phase change element, and each of the side heating contacts is electrically connected to a corresponding heating part. A fifth dielectric layer and a plurality of metal lines are formed on the side heating contact and the fourth dielectric layer. The metal lines act as bit lines of the phase change memory unit and each of the bit lines is electrically connected to the corresponding heating part.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Figure 1:
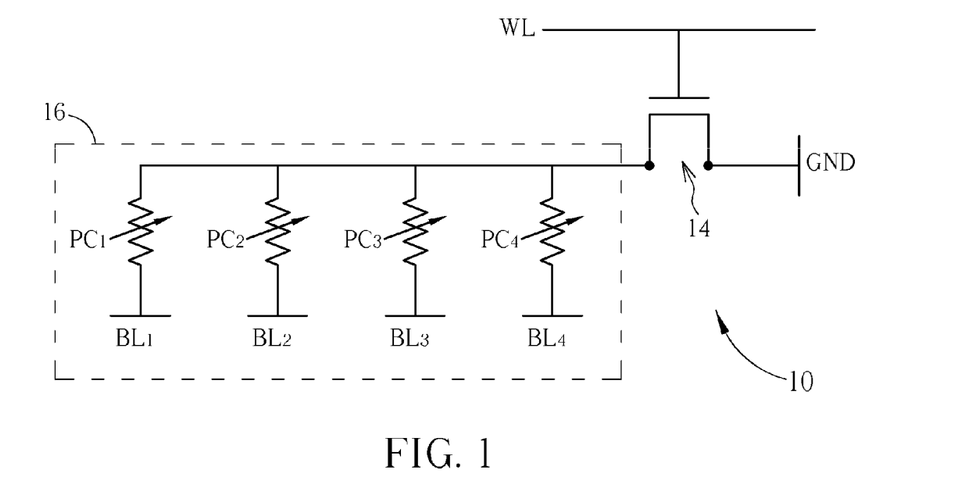
FIG. 1 is a schematic circuit diagram illustrating a phase change memory unit of the present invention.

The phase change memory of the present invention includes a plurality of phase change memory units. The following embodiments are illustrated with one phase change memory unit as the example to show advantages and characteristics of the present invention. Please refer to FIG. 1. FIG. 1 is a schematic circuit diagram illustrating a phase change memory unit 10 of the present invention. As shown in FIG. 1, phase change memory unit 10 has a word line WL, a metal-oxide semiconductor (MOS) transistor 14, a phase change element 16, and a plurality of bit lines. The phase change element 16 includes a plurality of phase change regions, such as four phase change regions $PC_1$, $PC_2$, $PC_3$, $PC_4$. In addition, the phase change element 16 may have more than four phase change regions. Each of the phase change regions $PC_1$, $PC_2$, $PC_3$, $PC_4$ is electrically connected to the respective bit lines $BL_1$, $BL_2$, $BL_3$, $BL_4$. The phase change regions $PC_1$, $PC_2$, $PC_3$, $PC_4$ are commonly connected to a source of the MOS transistor 14. The gate of the MOS transistor 14 is electrically connected to the world line WL1, and the drain of the MOS transistor 14 is electrically connected to the ground (GND). The MOS transistor 14 is switched by the voltage signal applied to the word line WL, and the resistance of the phase change regions $PC_1$, $PC_2$, $PC_3$, $PC_4$ is determined for programming. The bit lines $BL_1$, $BL_2$, $BL_3$, $BL_4$ are selected for reading or writing the information stored in the phase change regions $PC_1$, $PC_2$, $PC_3$, $PC_4$.

Several embodiments are shown in the following to emphasize the advantages and the characteristics of the present invention. These embodiments are illustrated with reference diagrams.

Figure 2:
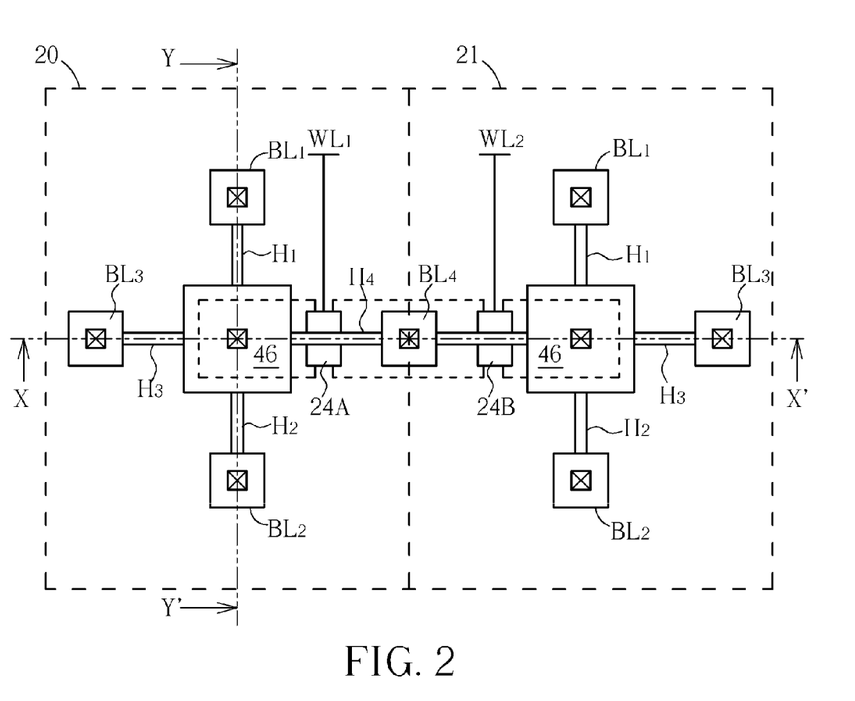
FIGS. 2-10 are schematic diagrams illustrating a phase change memory unit and the method for manufacturing the same according to a first embodiment of the present invention.

Please refer to FIG. 2 to FIG. 10, which are schematic diagram illustrating a phase change memory unit 20 and the method for manufacturing the same according to a first embodiment of the present invention. As shown in FIG. 2, two phase change memory units 20, 21 are shown, and the phase change memory units 20, 21 share the same bit line $BL_4$. The phase change memory units 20, 21 are symmetrical and have similar structures and components thereof. The phase change unit 20 is electrically connected to a word line $WL_1$, and the phase change unit 21 is electrically connected to a word line $WL_2$, respectively. For the sake of simplicity, the following description uses the phase change memory unit 20 as example to show its structure.

The phase change memory unit 20 has a word line WL1, a MOS transistor 24A, a phase change element 46, a plurality of heating parts $H_1$, $H_2$, $H_3$, $H_4$, and a plurality of bit lines $BL_1$, $BL_2$, $BL_3$, $BL_4$. The phase change element 46 is electrically connected to the heating parts $H_1$, $H_2$, $H_3$, $H_4$, which are disposed on the same plane. Each of the bit lines $BL_1$, $BL_2$, $BL_3$, $BL_4$ is electrically connected to a respective heating parts $H_1$, $H_2$, $H_3$, $H_4$. The structure of the phase change memory unit 20 and the position of the components are shown in FIGS. 2-4 and the related description in detail.

Figure 3:
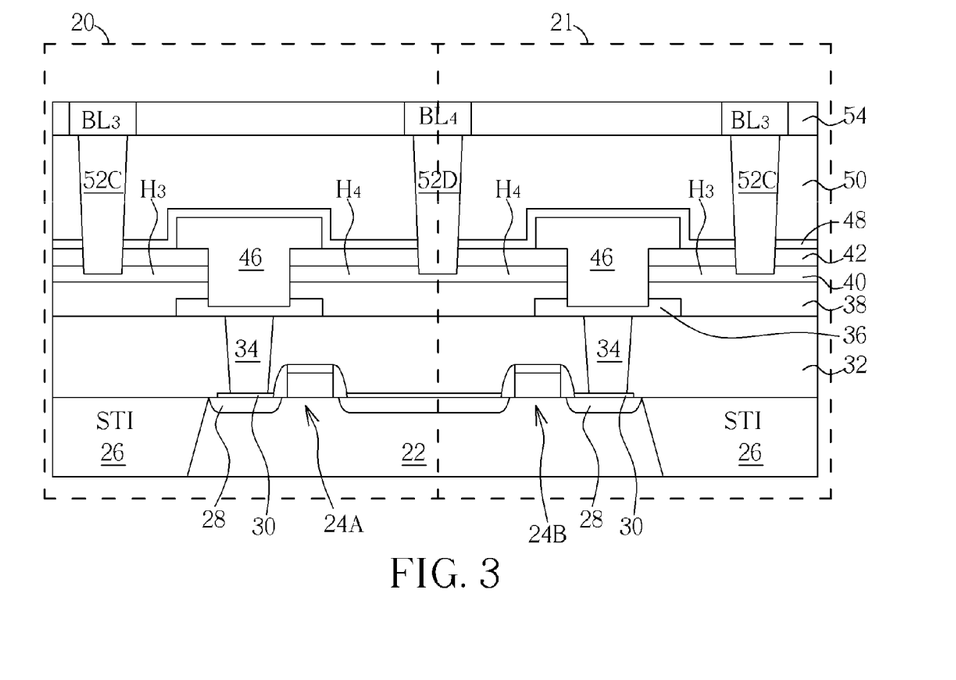
Figure 4:
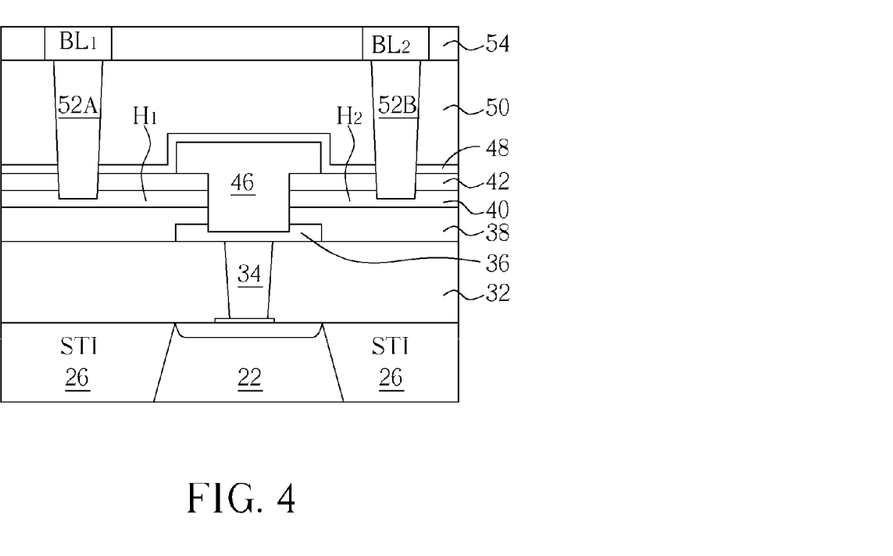

FIG. 3 is a schematic diagram of FIG. 2 taken along line X-X', and FIG. 4 is another schematic diagram of FIG. 2 taken along line Y-Y'. Please refer to FIGS. 2-4. The phase change memory unit 20 is disposed on a substrate 22, such as a silicon substrate, a silicon-on-insulator (SOI) substrate, or a semiconductor chip. A plurality of MOS transistors 24A, 24B and a plurality of shallow trench isolations (STI) 26 are disposed on the semiconductor substrate 22. A plurality of dielectric layers 32, 38, 42, 50, 54 are disposed on the semiconductor substrate 22. A phase change element 46 of the phase change memory unit 20 is embedded in the dielectric layers. A passivation layer 48 is positioned covering the phase change element 46. The gate of the MOS transistor 24A is electrically connected to word line $WL_1$ (shown in FIG. 2). The source/drain 28 of the MOS transistor 24A is electrically connected to the phase change element 46 through a lower electrode, such as a contact plug 34 shown in FIG. 3. The phase change memory unit 20 further includes a plurality of heating parts $H_1$, $H_2$, $H_3$, $H_4$, which are disposed on the same plane (as shown in FIG. 3 and FIG. 4). Each of the heating parts $H_1$, $H_2$, $H_3$, $H_4$ is electrically connected to a relative bit lines $BL_1$, $BL_2$, $BL_3$, $BL_4$ through a corresponding side heating contact 52A, 52B, 52C, and 52D.

As shown FIGS. 2-4, the heating parts $H_1$, $H_2$, $H_3$, $H_4$ are disposed on the same dielectric layer 38. The contact regions between the phase change element 46 and the heating parts $H_1$, $H_2$, $H_3$, $H_4$ are the phase change regions. When the word line $WL_1$ is selected by a control circuit, the phase change element 46 is conducted via the MOS transistor 24A. The bit lines $BL_1$, $BL_2$, $BL_3$, $BL_4$ are optionally selected to conduct the heating parts $H_1$, $H_2$, $H_3$, $H_4$ and so that the corresponding phase change regions are heated. The state of the heated phase change regions is therefore switched, and these heated phase change regions have a respective resistance for writing codes into the phase change memory unit 20 or for reading codes from the phase change memory unit 20.

Figure 5:
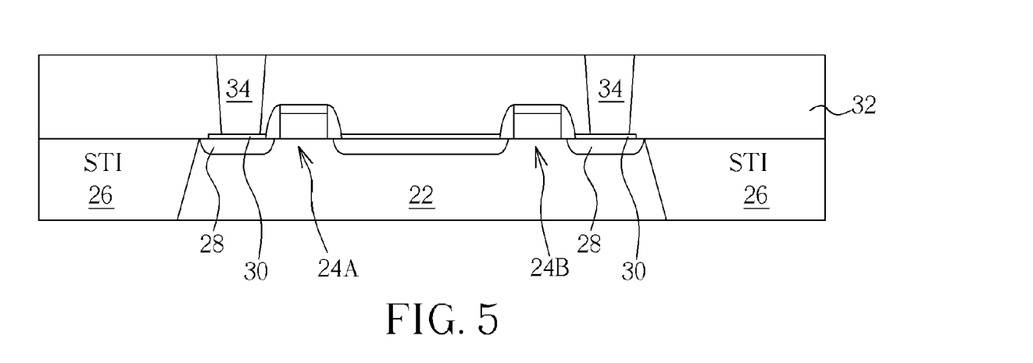

Please refer to FIGS. 5-10, which are schematic diagrams showing the method of manufacturing the phase change memory unit 20, 21 of the present invention. As shown in FIG. 5, a semiconductor substrate 22 is provided. A plurality of MOS transistors 24A, 24B and a plurality of isolation structures, i.e. STI 26, are disposed on the semiconductor substrate 22. Each of the MOS transistor 24A, 24B has a gate structure, a spacer disposed on a sidewall of the gate structure, a source/drain, and a channel region (not show) disposed in the substrate 22 under the gate structure. A silicide layer 30 is formed on a surface of the source/drain 28 and is capable of improving the Ohmic contact capability between metals and the silicon substrate. The silicide layer 30 may comprise Ni or Pt. A first dielectric layer 32 is formed on the semiconductor substrate 22 and the MOS transistor 24A, 24B. A contact etch stop layer (CESL) is optionally formed between the first dielectric layer 32 and the semiconductor substrate 22. A plurality of contact plugs 34 is formed through the first dielectric layer 32. The contact plugs are connected to the silicide layer 30 on the source/drain 28, and are electrically connected to the source/drain 28. The contact plugs 34 include metals of good conductivity, such as W, Al, Cu, or other metals used for conduction.

Figure 6:
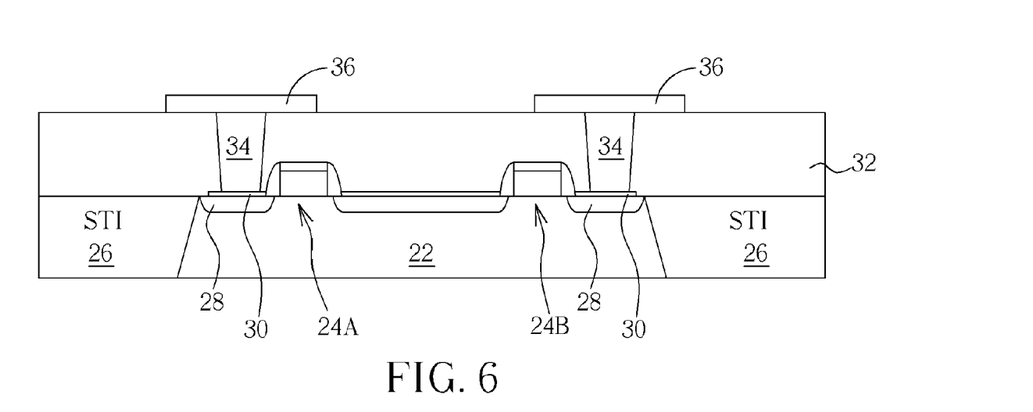

As shown in FIG. 6, a glue layer (not shown) is formed on the surface of the first dielectric layer 32. The glue layer may include Ti/TiN, Ta/TaN, or TiW. A photoresist is formed on the glue layer, and a lithography process and an etch process are performed to define the glue layer. A patterned glue layer 36 is formed covering the contact plugs 34 and a portion of the surface of the first dielectric layer 32. The patterned glue layer 36 may act as a barrier to prevent metal diffusion of the contact plugs 34 or the metal formed in the following process. The patterned glue layer 36 also improves the adhesion ability between metals and other materials.

Figure 7:
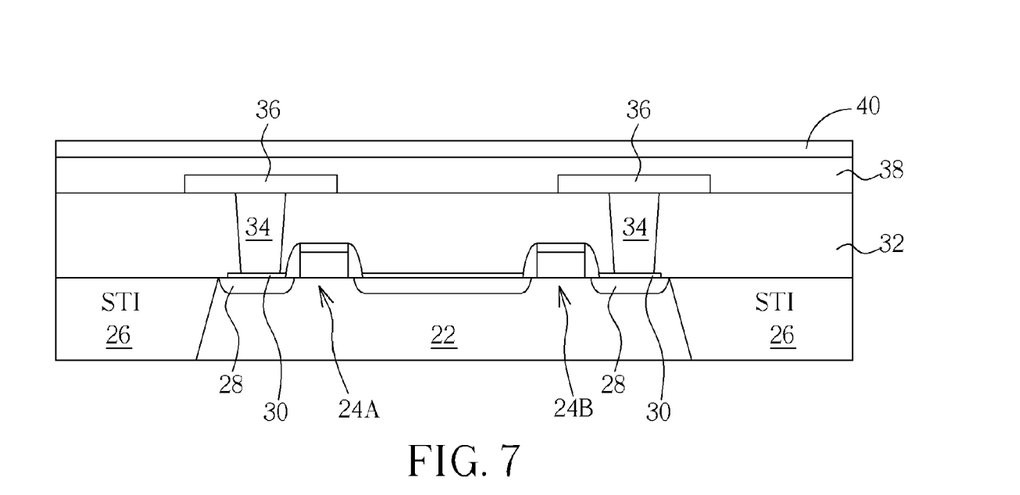

As shown in FIG. 7, a second dielectric layer 38 and a heating layer 40 are respectively formed on the first dielectric layer 32. The second dielectric layer 38 and the heating layer 40 may be formed by a CVD process or a plasma-enhanced CVD (PECVD) process. The heating layer 40 may include TiN, TaN, TiW, or other materials of high resistance and good adhesion ability. A photoresist layer (not shown) is formed on a surface of the heating layer 40. A lithography and an etch process are performed to define a pattern and formed the heating parts $H_1$, $H_2$, $H_3$, $H_4$ of the phase change memory units 20, 21.

Figure 8:
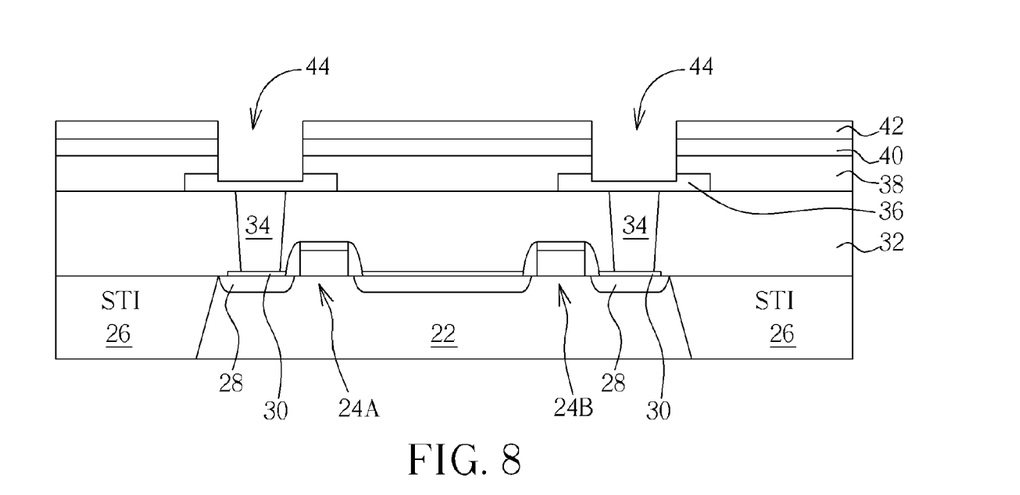

As shown in FIG. 8, a third dielectric layer 42 is formed on the second dielectric layer 38 and the patterned heating layer 40. A patterned photoresist (not shown) is formed on the third dielectric layer 42. The patterned photoresist has a plurality of openings corresponding to the contact plugs 34 embedded in the first dielectric layer 32. A etch process is performed to etch the third dielectric layer 42, the heating layer 40, and the second dielectric layer 38 using the patterned glue layer 36 as the etch stop layer. A plurality of openings 44 is formed in the third dielectric layer 42, the heating layer 40, and the second dielectric layer 38. Each opening 44 is corresponding to one contact plug 34. Then, the patterned photoresist is removed.

Figure 9:
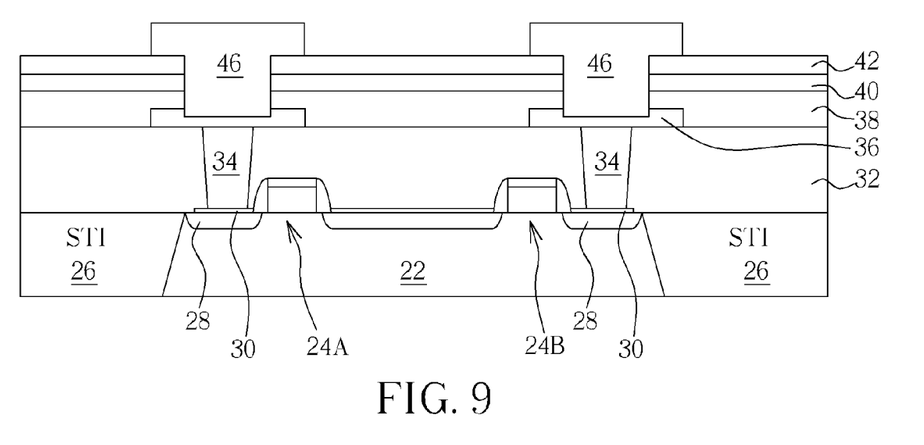

As shown in FIG. 9, a phase change material is formed covering a surface of the third dielectric layer 42 and fulfilling the openings 44. A photoresist (not shown) is formed on the surface of the phase change material. A lithography and etch process is performed to remove a portion of the phase change material, and so that, a plurality of phase change element 46. The phase change material may include Ge, Sb, Te, such as GeSbTe, AgInSbTe, and GeInSbTe. Furthermore, the phase change elements 46 may be formed by other method. For example, a CMP process may be performed to remove the phase change material disposed on the surface of the third dielectric layer 42 after the phase change material is deposited. The phase change material elements 46 formed by the CMP process has a top surface that is substantially leveled with the surface of the third dielectric layer 42.

Figure 10:
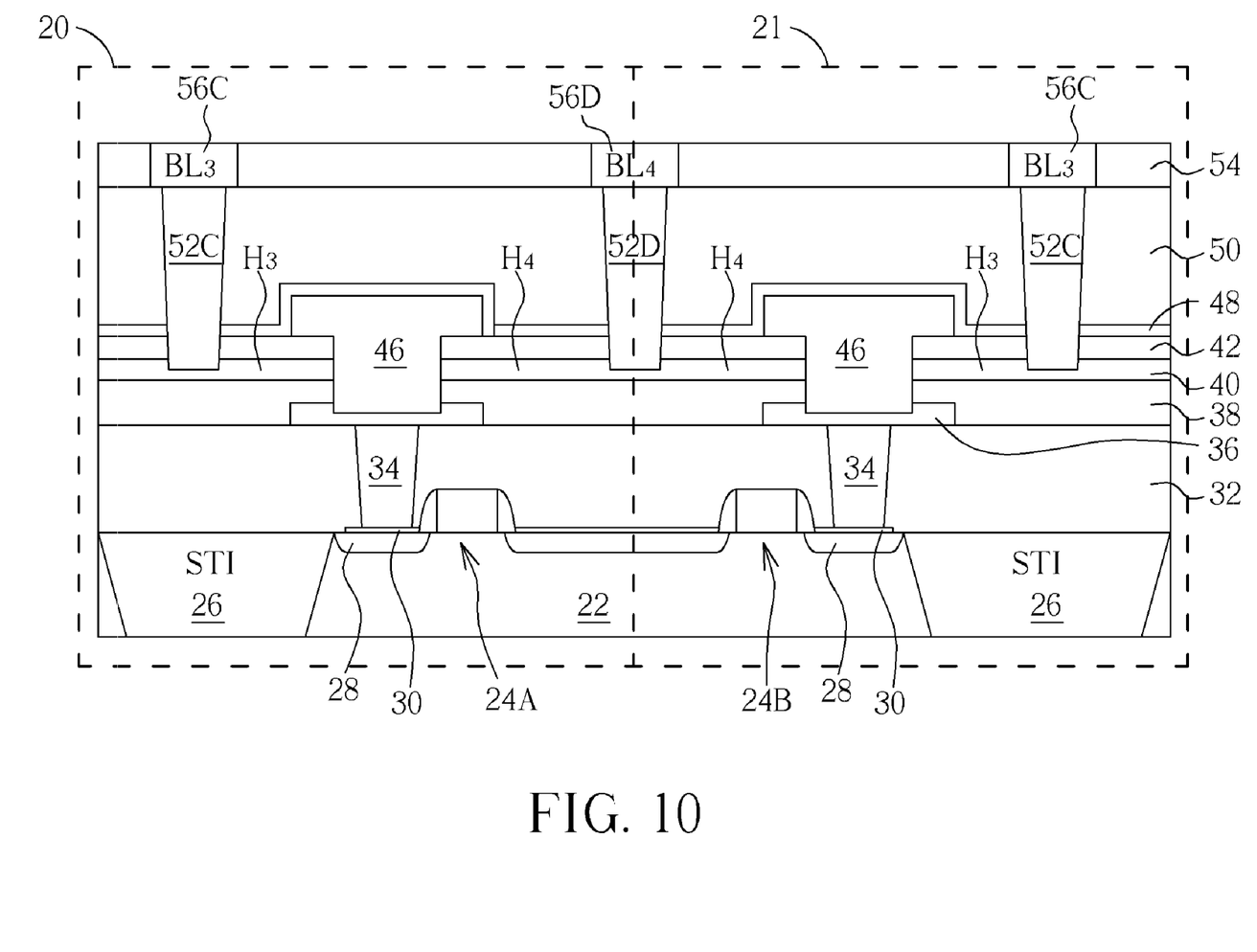

As shown in FIG. 10, a passivation layer 48, such as a SiN layer, and a fourth dielectric layer 50 are subsequently formed. A patterned photoresist is formed on a surface of the fourth dielectric layer 50. The patterned photoresist has a plurality of openings relatively positioned around the phase change element 46; i.e. the openings are positioned as a cross over the phase change elements 46 (shown in FIG. 2). An etch process is performed to etch the fourth dielectric layer 50, the passivation layer 48, the third dielectric layer 42, and a portion of the heating layer 40. A plurality of side via holes (not shown) is formed around the phase change elements 46. A deposition process is performed to deposit suitable metal, such as Ti/TiN, Ta/TaN, W, Al, or Cu, covering the fourth dielectric layer 50 and fulfilling the side via holes. A CMP process is performed to remove the metal disposed on the surface of the fourth dielectric layer 50, and a plurality of side heater contacts 52A, 52B, 52C, 52D is formed. Afterward, a metal interconnection process, such as an Al process, or a Cu damascene process, is performed to form a fifth dielectric layer 54 on the fourth dielectric layer 50 and a plurality of metal traces 56A, 56B, 56C, 56D in the fifth dielectric layer 54. The metal traces 56A, 56B, 56C, 56D are used as the bit lines $BL_1$, $BL_2$, $BL_3$, $BL_4$ of the phase change material unit 20. In addition, the metal traces 56A, 56B, 56C, 56D may be the power lines or the bonding pads of the phase change memory units 20, 21. The function of the metal traces 56A, 56B, 56C, 56D depends on the circuit layout. Furthermore, the side heater contacts 52A, 52B, 52C, 52D and the metal traces 56A, 56B, 56C, 56D may be formed by a damascene process. For example, a damascene structure including a trench and a via hole is formed in the dielectric layers. A Cu layer is formed to fulfill the damascene structure, and a CMP process is performed to form the side heater contacts 52A, 52B, 52C, 52D and the metal traces 56A, 56B, 56C, 56D simultaneously. The material of the dielectric layers including first dielectric layer 32, the second dielectric layer 38, the third dielectric layer 42, the fourth dielectric layer 50, and the fifth dielectric layer 54 may comprise low-k materials, such as silicon oxide, fluorinated silica, or organosilicate.

Figure 11:
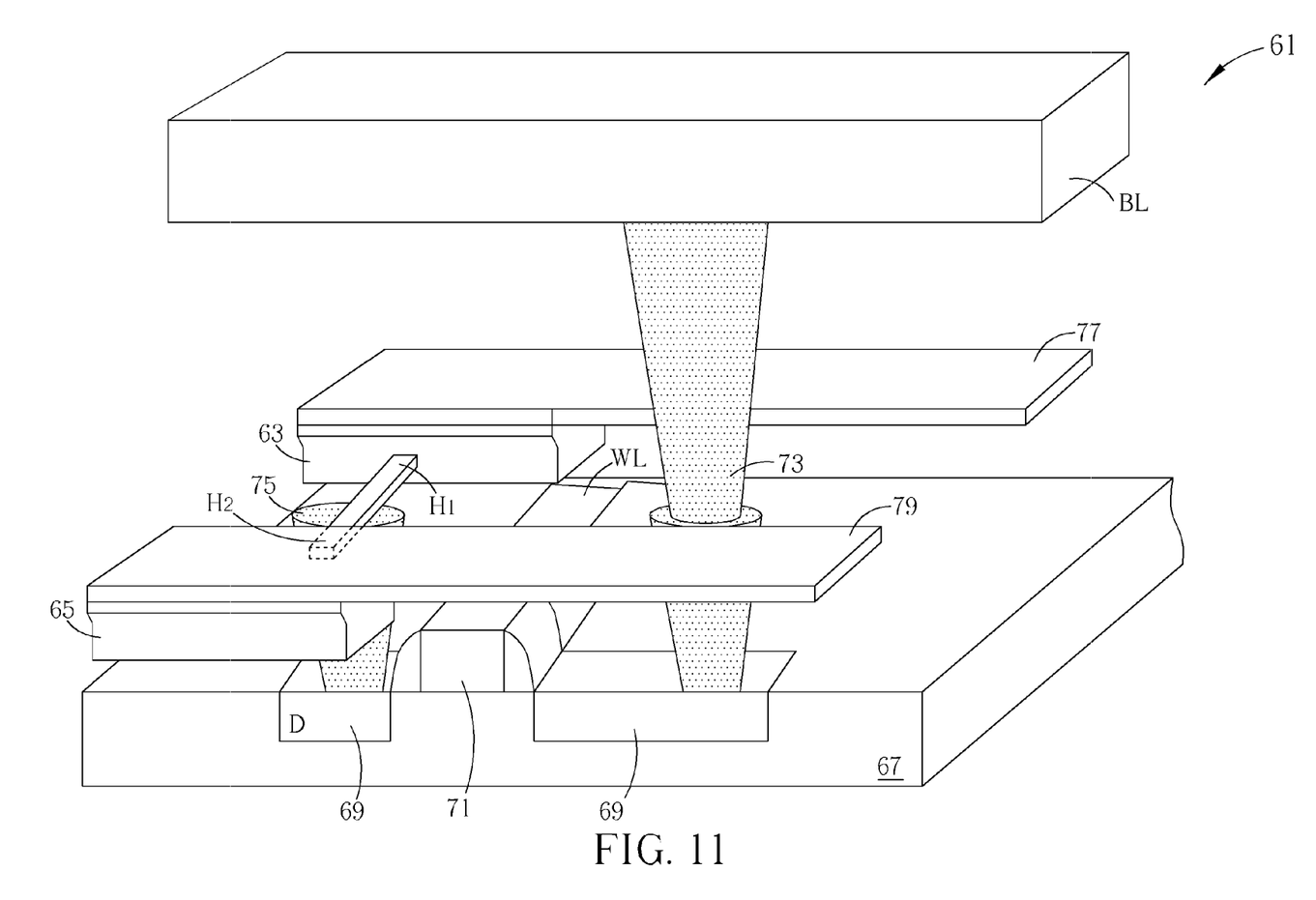
FIG. 11 is schematic diagram illustrating a phase change memory unit according to a second embodiment of the present invention.

The connection between the elements of the phase change memory unit may be modified. Please refer to FIG. 11, which is a schematic diagram of a phase change memory unit 61 according to a second embodiment of the present invention. As shown in FIG. 11, the phase change memory unit 61 has a word line WL, a bit line BL, a plurality of phase change elements 63, 65, and a plurality of heating parts $H_1$, $H_2$. The word line WL is disposed on a substrate 67, and a source/drain 69 is formed beside the word line WL. A portion of the word line WL between the source/drain 69 is therefore defined as a gate 71, and so that a MOS transistor is formed. The source/drain 69 disposed on the substrate 67 is electrically connected to the bit line BL through a first electrode 73, such as a contact plug. The source/drain 69 is also electrically connected to the heating parts $H_1$, $H_2$ of the phase change memory unit 61, in which the heating parts $H_1$, $H_2$ are electrically connected to the corresponding phase change elements 63 and 65. Therefore, the bit line BL of the phase change memory unit 61 is electrically connected to the heating parts $H_1$, $H_2$ indirectly. In addition, the phase change elements 63 is electrically connected to a first conductive line 77, and the phase change elements 65 is electrically connected to a second conductive line 79. As a result, when the word line WL, the bit line BL, and the first conductive line 77 are selected, the phase change element 63 is selected for reading or writing codes. On the other hand, when the word line WL, the bit line BL, and the second conductive line 79 are selected, the phase change element 65 is selected for reading or writing codes.

Figure 12:
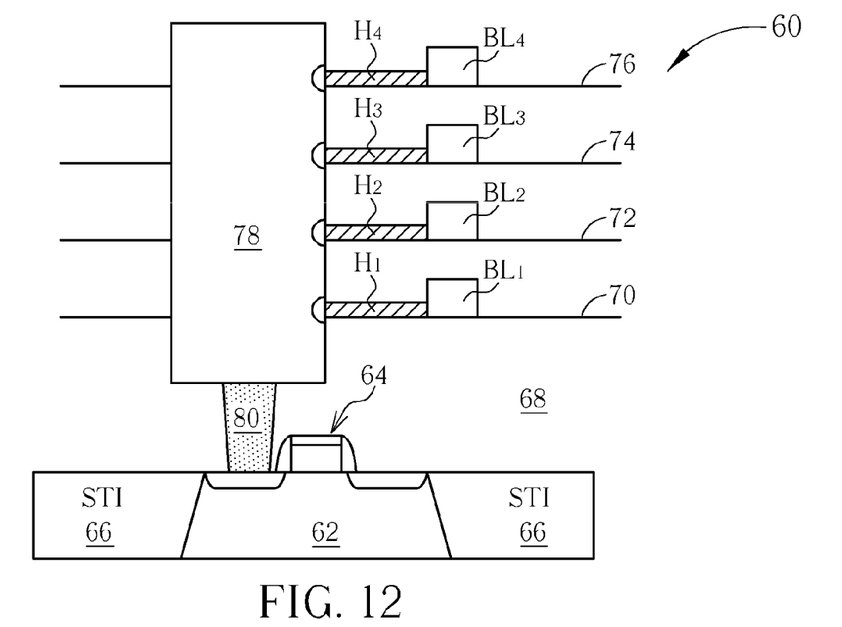
FIG. 12 is schematic diagram illustrating a phase change memory unit according to a third embodiment of the present invention.

The present invention further discloses a third embodiment with reference of FIG. 12. The components shown in FIG. 12 are shown in a simplified form, and components with substantially the same functions are identified by the same reference numeral for the sake of simplicity. As shown in FIG. 12, a phase change memory unit 60 is disclosed. The phase change memory unit 60 has a phase change element 78, a lower electrode 80, a plurality of multi-leveled heating parts $H_1$, $H_2$, $H_3$, $H_4$, and a plurality of bit lines $BL_1$, $BL_2$, $BL_3$, $BL_4$. Each of the bit lines $BL_1$, $BL_2$, $BL_3$, $BL_4$ is electrically connected to the corresponding heating parts $H_1$, $H_2$, $H_3$, $H_4$. The phase change memory unit 60 is disposed on a semiconductor substrate 62, which has a MOS transistor 64 and a plurality of STIs 66 disposed thereon. A plurality of inter-level dielectric (ILD) layers 68, 70, 72, 74, 76 is formed on the semiconductor substrate 62. The phase change element 78 of the phase change memory unit 60 is embedded in the ILD layers 68, 70, 72, 74, 76 and is electrically connected to the multi-leveled heating parts $H_1$, $H_2$, $H_3$, $H_4$ disposed on the different planes. The phase change element 78 is electrically connected to a source/drain of the MOS transistor through the lower electrode 80, such as a contact plug shown in the diagram. The gate of the MOS transistor 64 is electrically connected to a word line (not shown). The control circuit may select the word line and the bit lines $BL_1$, $BL_2$, $BL_3$, $BL_4$ to read the information stored in the phase change regions between the phase change element 78 and the heating parts $H_1$, $H_2$, $H_3$, $H_4$. In addition, the heating parts $H_1$, $H_2$, $H_3$, $H_4$ of the first embodiment are disposed on the same dielectric layer. The heating parts $H_1$, $H_2$, $H_3$, $H_4$ of the third embodiment are disposed on different planes and are disposed on the ILD layers 68, 70, 72, 74, 76 respectively. However, some of the heating parts may be disposed on the same layer. For example, the heating parts $H_1$, $H_2$ are disposed on the ILD layer 68, and the heating parts $H_3$, $H_4$ are disposed on the ILD layers 72, 74, respectively. Furthermore, FIG. 12 shows that the heating parts $H_1$, $H_2$, $H_3$, $H_4$ and the corresponding bit lines $BL_1$, $BL_2$, $BL_3$, $BL_4$ are disposed on different levels. The heating part and the bit line may be connected by a contact plug, a metal interconnection, or other means understood by those skilled in the art. In addition, the lower electrode of the first embodiment and the third embodiment is a contact plug. The lower electrode may be replaced by a metal layer or a metal interconnection.

Figure 13:
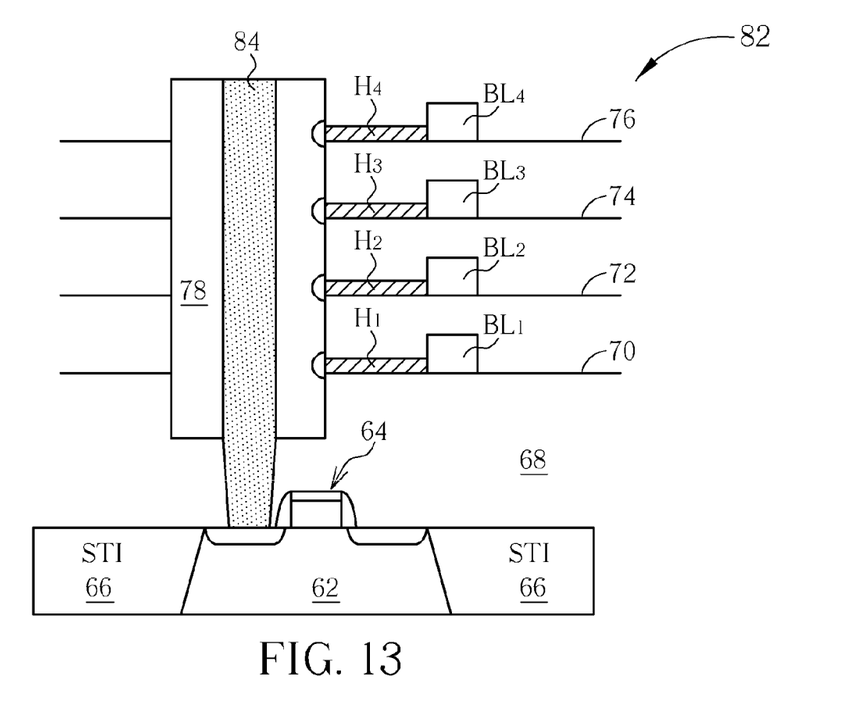
FIG. 13 is schematic diagram illustrating a phase change memory unit according to a fourth embodiment of the present invention.

Since the resistance of the phase change material is greater than that of the contact plug. The distance between the heating part and the lower electrode is varied depending on the position of the heating part that may results in extra resistance inaccuracy. In order to eliminate resistance inaccuracy, a fourth embodiment is disclosed. Components shown in the third embodiment having substantially some functions as those shown in the third embodiment are identified by the same numeral reference. Please refer to FIG. 13, which shows a phase change memory unit 82 disposed on the semiconductor substrate 22. A MOS transistor 64, a plurality of STIs 66, and a plurality of ILD layers 68, 70, 72, 74, 76 are formed on the semiconductor substrate 22. The phase change memory unit 82 includes a phase change element 78 and a plurality of heating parts $H_1, H_2, H_3, H_4$, which are respectively disposed on the ILD layers 68, 70, 72, 74, 76. In the contrast to the third embodiment, the phase change memory unit 80 has a metal plug 84 embedded in the phase change element 78. The metal plug 84 is formed through the phase change element 78 and is electrically connected to the source/drain of the MOS transistor 64. The gate of the MOS transistor 64 is electrically connected to a word line (not shown). Therefore, the resistance inaccuracy resulting from the distance between the heating parts and the lower electrode is eliminated. The metal plug 84 may be formed by etching the phase change element 78 and the ILD layer 68 to form a through hole subsequent to the formation phase changed element 78. Metal of good conductivity is deposited into the through hole, such as W, Al, or Cu, and so that the metal plug 84 is formed.

Figure 14A:
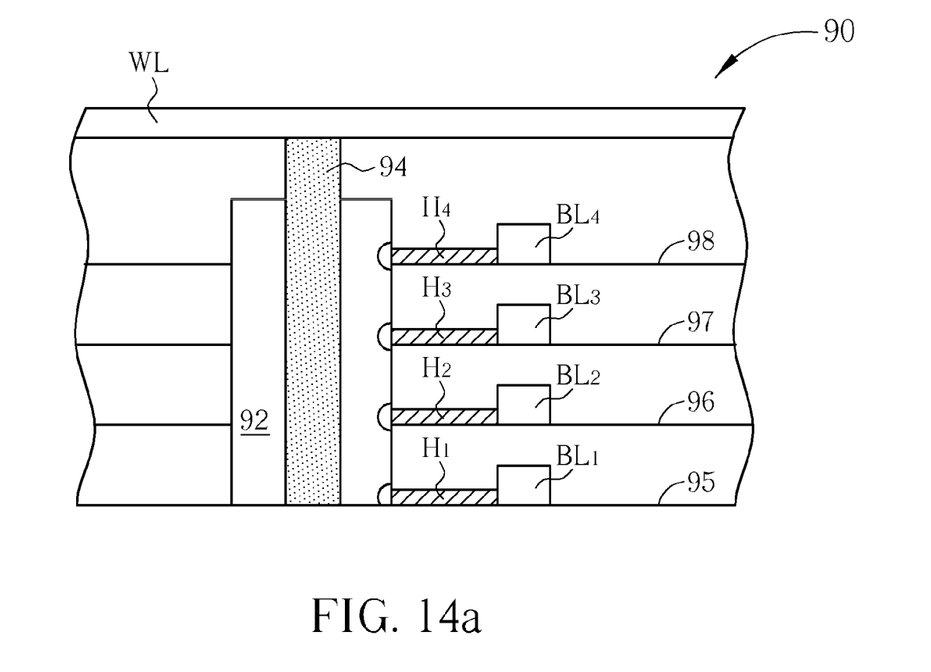
FIG. 14a and FIG. 14b are schematic diagrams illustrating a phase change memory unit according to a fifth embodiment of the present invention.
Figure 14B:
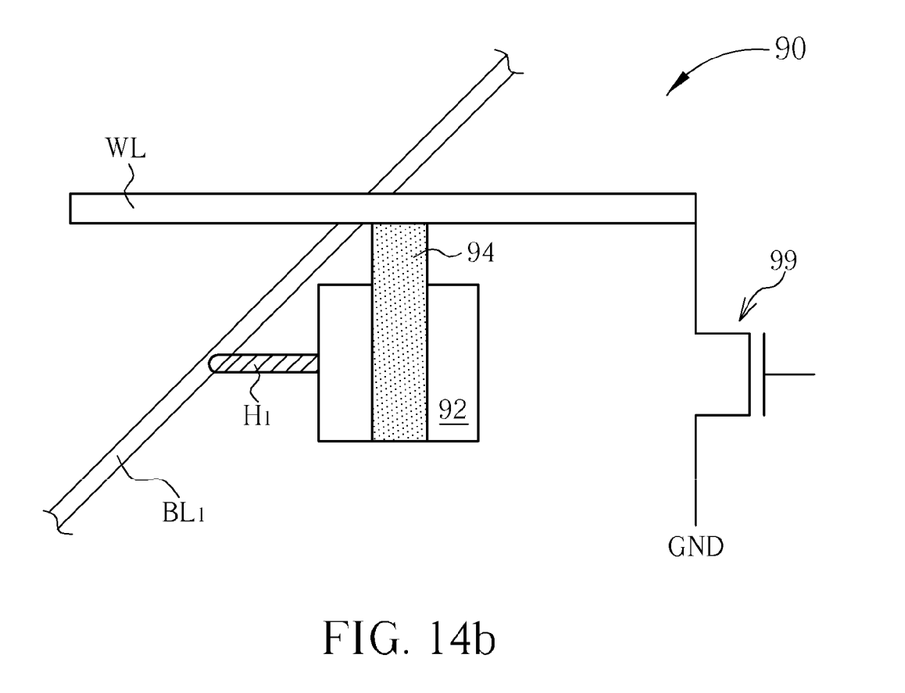

The phase change elements of the above-mentioned embodiments are connected to the MOS transistor though a contact plug or a metal plug, but are not limited to this. It is allowable to connect several phase change elements to the same MOS transistor. The phase change element may also connect to any MOS transistor without direct contact. A fifth embodiment of the present invention is disclosed in reference with FIG. 14a and FIG. 14b. FIG. 14a shows a schematic diagram of a phase change memory unit 90 without a MOS transistor disposed within the unit. The phase change memory unit 90 includes a world line WL, a phase change element 92, a through plug 94 disposed in the phase change element 92, a plurality of heating parts $H_1, H_2, H_3, H_4$ electrically connected to the phase change element 92, and a plurality of corresponding bit lines $BL_1, BL_2, BL_3, BL_4$ electrically connected to the heating parts $H_1, H_2, H_3, H_4$. The heating parts $H_1, H_2, H_3, H_4$ are respectively disposed on the IMD layers 95, 96, 97, 98. The phase change element 92 is embedded in the IMD layer 95, 96, 97, 98. The IMD layers may be formed on a semiconductor substrate or a chip and so that it is allowable to combine the phase change memory unit 90 with other electronic devices. The phase change element 92 is electrically connected directly to the word line WL by the through plug 94 disposed therein. However, there is no MOS transistor disposed within the cell of the phase change unit 90. With reference to FIG. 14b, the word line WL of the phase change memory unit 90 is connected to the phase change element 92 in the one end, and is further connected to a MOS transistor 99 in the other end. The MOS transistor 99 may be disposed in a logic device region of a semiconductor substrate or a chip out of a memory region having phase change memory units 90 therein. Since the MOS transistor is disposed out of the phase change memory unit 90, the size of the memory region on the semiconductor substrate or the chip may be minimized.

Figure 15:
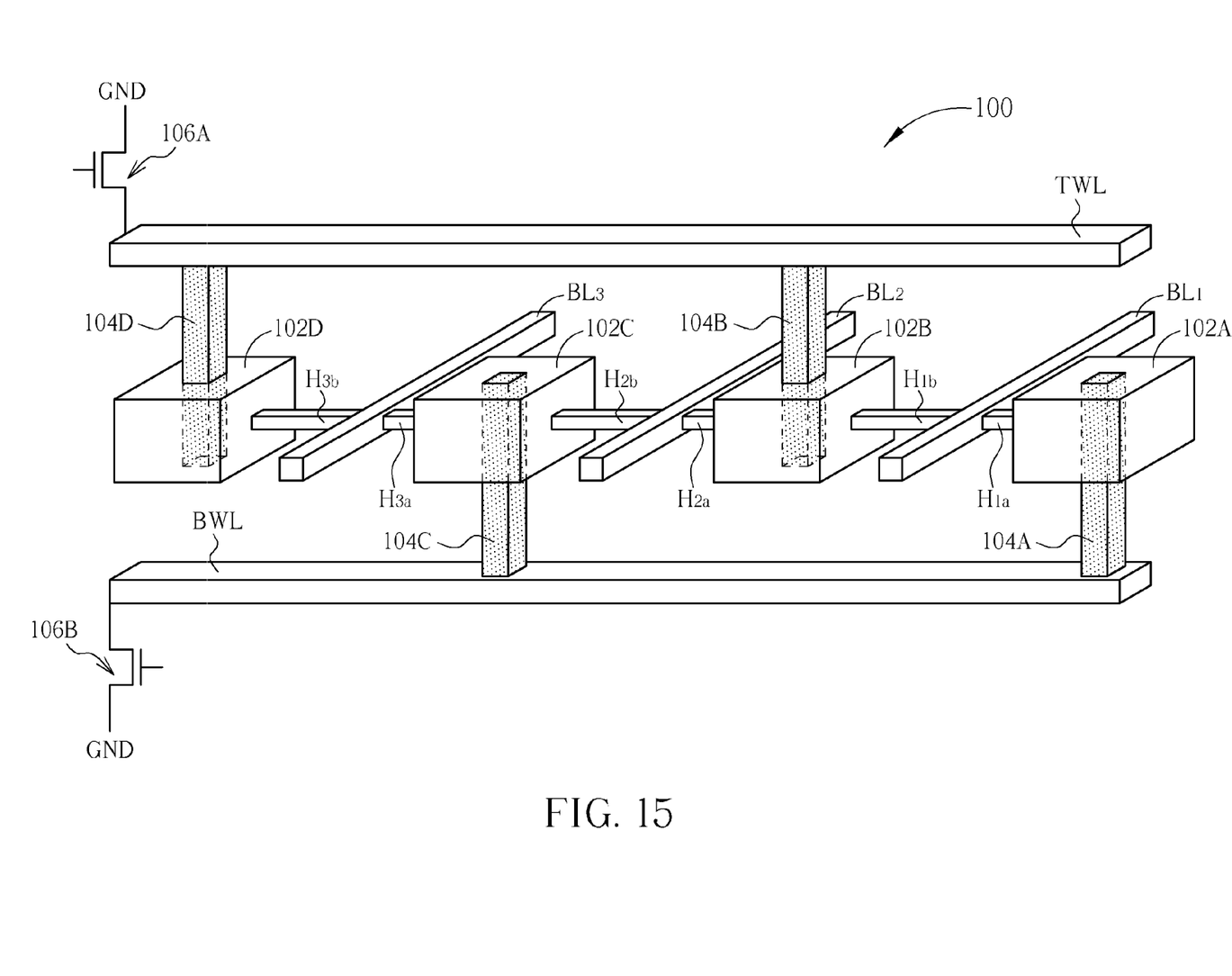
FIG. 15 is schematic diagram illustrating a phase change memory unit according to a sixth embodiment of the present invention.

Due to trends toward higher-levels of integration of the phase change memory, the relative position of the word line and the phase change element may be modified. A sixth embodiment is shown with reference to FIG. 15. A phase change memory unit 100 has a plurality of phase change elements 102A, 102B, 102C, 102D and a plurality of through plugs 104A, 104B, 104C, 104D disposed therein. The phase change elements 102A and 102C are connected to a bottom bit line BWL by the respective through plugs 104A and 104C. The phase change elements 102B and 102D are connected to a top bit line TWL by the respective through plugs 104B and 104D. The top word line TWL is further connected to a MOS transistor 106A, and the bottom line BWL is further connected to a MOS transistor 106B. It should be noted that the through plugs 104A, 104B, 104C, 104D of the fifth embodiment are disposed to go through the phase change elements 102A, 102B, 102C, 102D. Nevertheless, these through plugs 104A, 104B, 104C, 104D could also be formed to only contact the phase change elements 102A, 102B, 102C, 102D or disposed partially within the phase change elements 102A, 102B, 102C, 102D, which are also within the scope of the present invention. The phase change memory unit 100 further includes a plurality of bit lines $BL_1, BL_2, BL_3$. The bit line $BL_1$ is connected to the phase change elements 102A and 102B through a respective heating parts $H_{1a}$ and $H_{1b}$. The bit line $BL_2$ is connected to the phase change elements 102B and 102C through a respective heating parts $H_{2a}$ and $H_{2b}$. The bit line $BL_3$ is connected to the adjacent phase change elements 102C and 102D through a respective heating parts $H_{3a}$ and $H_{3b}$. Therefore, when the bit line $BL_1$ is selected by the control circuit, the heating parts $H_{1a}$, $H_{1b}$ is conducted to generate heat to the connected phase change elements 102A, 102B. If the top word line TWL is selected, the phase change element 102B connected to the top word line TWL by the through plug 104B is conducted, and the information stored in the phase change region between the phase change element 102B and heating part $H_{1b}$ is read. On the other hand, if the bottom word line BWL is selected, information stored in the phase change region between the heating part $H_{1a}$ and the phase change element 102A is read. The adjacent phase change memory elements of the phase change memory unit 100 are commonly connected to the same bit line; i.e., the phase change elements 102A, 102B are electrically connected to the bit line $BL_1$. Therefore, the number of the essential bit lines is reduced. In addition, the neighboring phase change elements are commonly connected to the same word line; i.e. phase change elements 102A, 102C are commonly connected to the bottom word line BWL, and the phase change elements 102B, 102D are commonly connected to the top word line TWL. As a result, the number of the bit lines and the word lines is reduced, and so that the phase change memory of the present invention has a higher level of integration.

Figure 16:
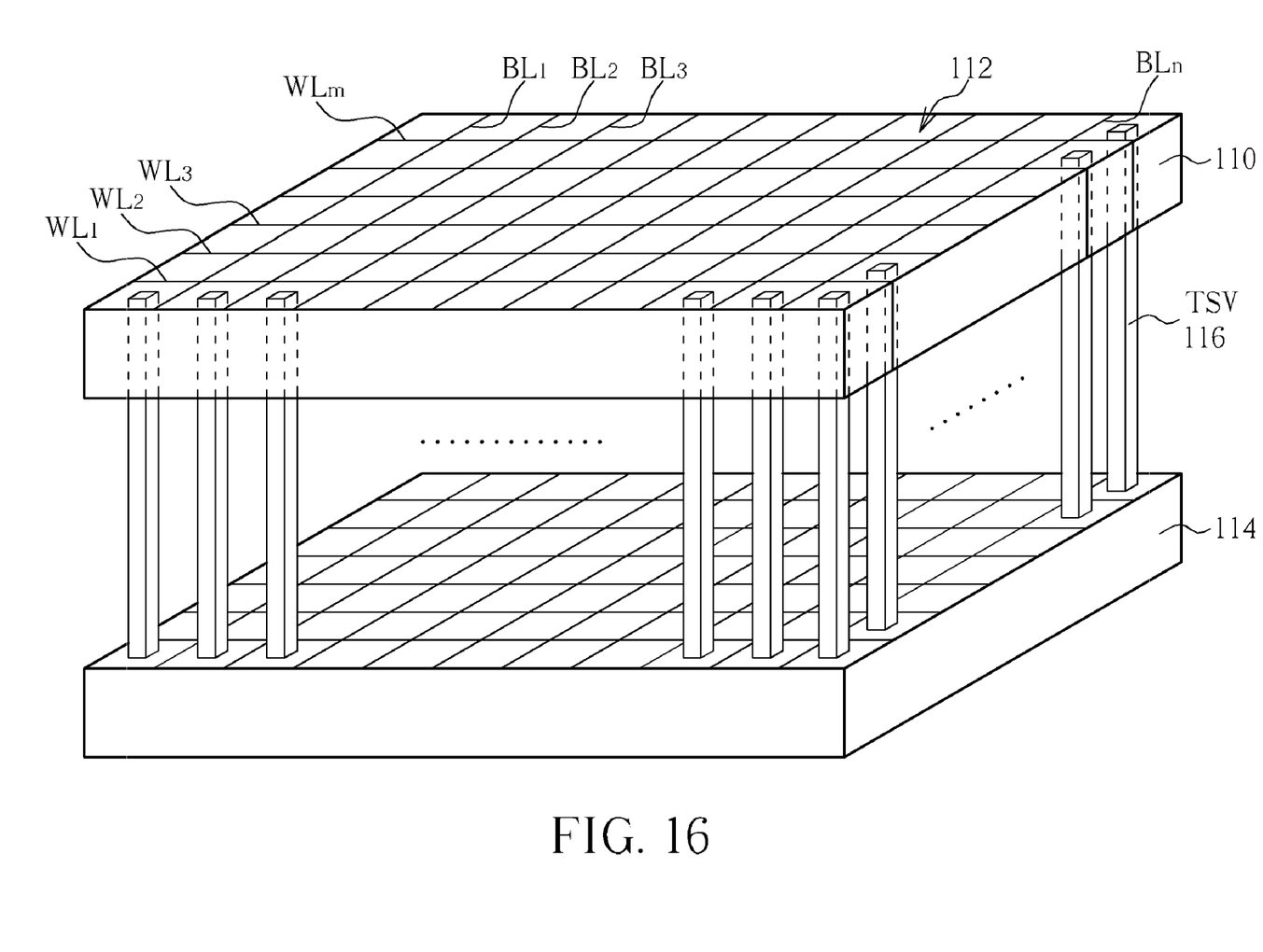
FIG. 16 and FIG. 17 are schematic diagrams illustrating a phase change memory unit according to a seventh embodiment of the present invention.
Figure 17:
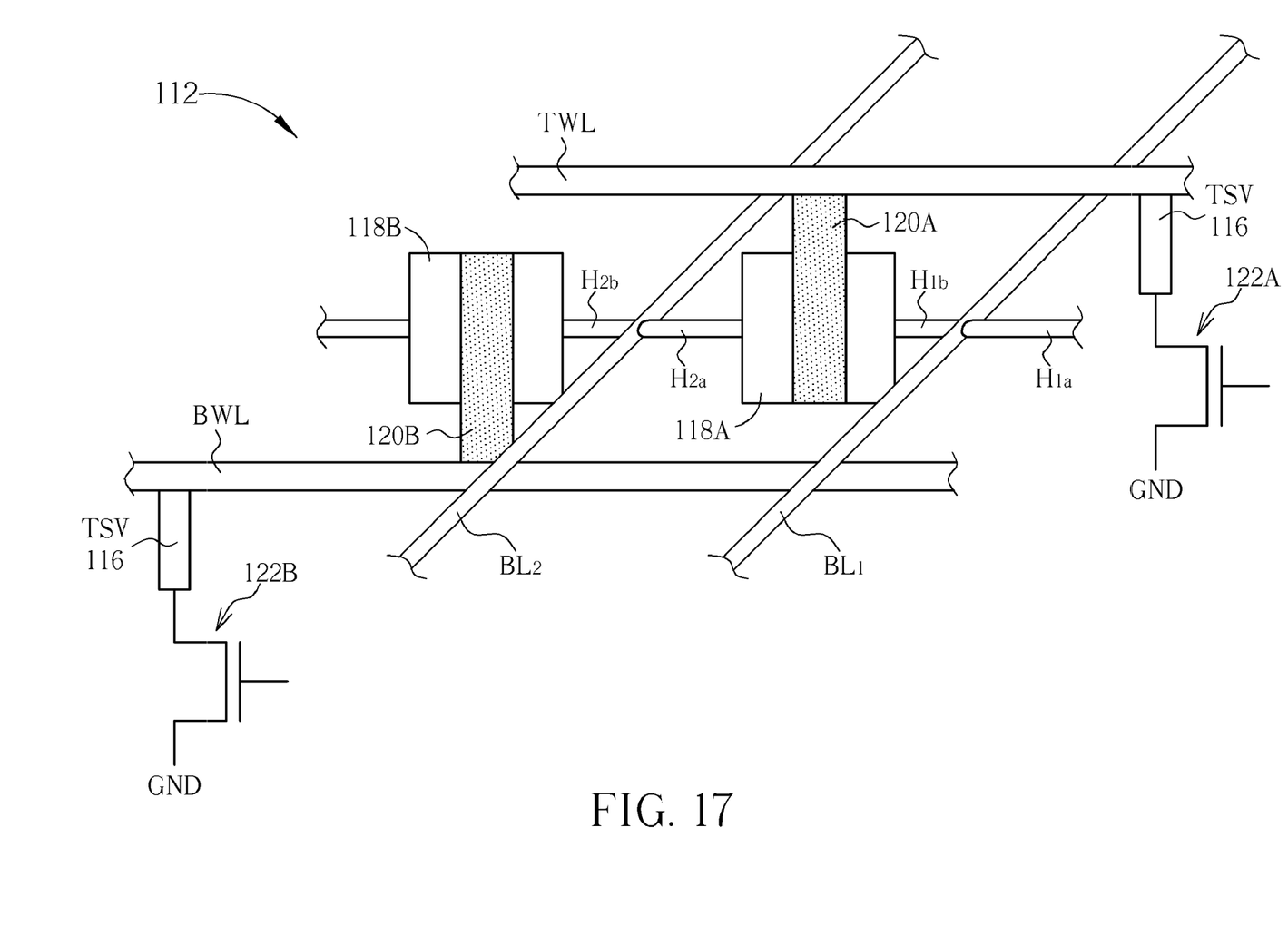

The MOS transistors of the fifth embodiment and the sixth embodiment are disposed in the logic device region of a chip or a semiconductor substrate, and the logic device region is located out of the memory region having phase change memory units thereof. In addition, the MOS transistors and the phase change memory unit are formed on the same chip or semiconductor substrate. Therefore, a seventh embodiment of the present invention is provided, in which the MOS transistors and the phase change memory units are disposed on different chips. Referring to FIG. 16, a plurality of phase change memory units 112 formed by the back-end of the line is disposed on a first chip 110. A plurality of word lines $WL_1$, $WL_2, WL_3 \ldots WL_n$ and a plurality of bit lines $BL_1, BL_2, BL_3 \ldots BL_n$ respectively corresponding to the phase change memory units 112 are formed on the first chip 110. In addition, a plurality of MOS transistors and the circuit connected to the MOS transistors are formed by the front-end of the line and are disposed on a second chip 114. Please refer to FIG. 17 in company with FIG. 16, in which FIG. 16 is a schematic diagram of one phase change memory unit 112. The phase change memory unit 112 has a plurality of phase change elements 118A, 118B, a plurality of through plugs 120A, 120B disposed through the respective phase change elements 118A, 118B, a plurality of bit lines $BL_1$, $BL_2$, a top word line TWL, and a bottom word line BWL. These components of the phase change unit 112 are connected as those of the phase change unit 110 of the fifth embodiment. For example, the bit line $BL_1$ is electrically connected to the phase change element 118A by a heating part $H_{1b}$. The bit line $BL_2$ is electrically connected to the adjacent phase change elements 118A, 118B by a respective heating part $H_{2b}$, $H_{2b}$. The phase change element 118A is electrically connected to the top word line TWL by an upward through plug 120A disposed therein, and the phase change element 118B is electrically connected to the bottom word line BWL by the downward through plug 120B disposed therein. The through plugs 102A and 102B of the sixth embodiment are formed to go through the phase change elements 118A and 118B. Nevertheless, these through plugs 102A and 102B could also be formed to only contact the phase change elements 118A and 118B or disposed partially within the phase change elements 118A and 118B, which are also within the scope of the present invention. In addition, the top word line TWL and the bottom word line BWL are electrically connected to the respective MOS transistors 122A, 122B by a respective through silicon via (TSV) 116. The TSV 116 penetrates the first chip 110 and connects to the MOS transistors 122A, 122B on the second chip 114. Therefore, the first chip 110 having phase change memory units 112 thereof may be manufactured by the advanced 45 nanometer process. In the contrast, the second chip 114 having the MOS transistors 122A, 122B and the circuit may be formed by a 90 nanometer process, so as to reduce the production cost. Meanwhile, phase change memory units 112 on the first chip 110 and the MOS transistors 122A, 122B on the second chip 114 are electrically connected by the TSVs 116. As a result, the phase change memory of the present invention has a higher level of integration and a lower cost for production.

According to aforementioned embodiments, the present invention discloses a high-density phase change memory unit and the method for manufacturing the same. The phase change memory element of the phase change memory unit is connected to a plurality of heating parts and the corresponding bit lines. The MOS transistor connected to the phase change element may be disposed within the phase change memory unit or be disposed in a region out of the memory region having phase change units. In addition, the phase change units disposed on the same chip may share the bit lines and word lines, and so that, the number of the components disposed on the chip is reduced and the density of the phase change memory units is increased.

Those skilled in the art will readily observe that numerous modifications and alterations of the device and method may be made while retaining the teachings of the invention.

What is claimed is:

1. A phase change memory unit, comprising:
    a word line;
    a phase change element having a plurality of phase change regions;
    a plurality of bit lines; and
    a plurality of heating parts electrically connected to the phase change regions of the phase change element respectively, each of the heating parts being electrically connected to a corresponding bit line.

2. The phase change memory unit of claim 1, wherein the phase change element is electrically connected to the word line.

3. The phase change memory unit of claim 1, wherein the heating parts are positioned on the same plane.

4. The phase change memory unit of claim 1, wherein the heating parts are positioned on different planes.

5. The phase change memory unit of claim 4, wherein the phase change memory unit comprises a metal plug embedded in the phase change element that is positioned perpendicular to the heating parts, and the metal plug is electrically connected to the source/drain of a MOS transistor.

6. The phase change memory unit of claim 4, wherein the phase change memory unit comprises a through plug disposed in the phase memory element that is positioned perpendicular to the heating parts, and the through plug is electrically connected to the word line directly.

7. The phase change memory unit of claim 6, wherein the phase change memory unit further comprises a MOS transistor, in which a gate of the MOS transistor is electrically connected to the word line.

8. The phase change memory unit of claim 6, wherein the phase change memory unit further comprises a MOS transistor, in which a source/drain of the MOS transistor is electrically connected to the word line.

9. The phase change memory unit of claim 8, wherein the phase change unit comprises a through silicon via electrically connected to the source/drain of the MOS transistor.

10. A method of manufacturing a phase change memory unit, comprising:
    providing a semiconductor substrate having at least a MOS transistor, a first dielectric layer, and a contact plug disposed in the first dielectric layer, wherein the contact plug is used as a lower electrode of the phase change memory unit and is electrically connected to a source/drain of the MOS transistor;
    forming a second dielectric layer covering the first dielectric layer;
    forming a patterned heating layer on the second dielectric layer to define a plurality of heating elements;
    forming a third dielectric layer covering the heating elements;
    forming a phase change element embedded in the second dielectric layer and the third dielectric layer, the phase change element being electrically connected to a patterned glue layer;
    forming a fourth dielectric layer covering the phase change element and the third dielectric layer;
    forming a plurality of side heating contacts embedded in the third dielectric layer and the fourth dielectric layer, the side heating contacts being positioned around the phase change element, and each of the side heating contacts being electrically connected to a corresponding heating part; and
    forming a fifth dielectric layer and a plurality of metal traces on the side heating contacts and the fourth dielectric layer, wherein the metal traces act as bit lines of the phase change memory unit and each of the bit lines is electrically connected to the corresponding heating part.

11. The method of claim 10, wherein forming the phase change element comprises steps of:
    performing a etch process to etch the third dielectric layer and the second dielectric layer and to form a opening that exposes the patterned glue layer;
    forming a phase change material covering the third dielectric layer and fulfilling the opening; and
    removing a portion of the phase change material disposed on a surface of the third dielectric layer that defines the phase change element in the opening.

12. The method of claim 10, wherein a gate of the MOS transistor is electrically connected to a word line.

13. The method of claim 10, further comprising forming a passivation layer disposed between the phase change element and the fourth dielectric layer.

14. The method of claim 10, further comprising forming the patterned glue layer on a surface of the lower electrode and a portion of the first dielectric layer before forming the second dielectric layer.

15. A phase change memory unit, comprising:
- a top word line and a bottom word line;
- a plurality of phase change elements disposed between the top word line and the bottom word line, wherein a portion of the phase change elements is electrically connected to the top word line and the rest of the phase change elements are electrically connected to the bottom word line;
- a plurality of bit lines between the phase change elements, the top word line, and the bottom word line;
- a plurality of heating parts electrically connected to the adjacent phase change elements to a corresponding bit line, and
- a plurality of through plugs electrically connected to the phase change elements to the corresponding top word line or bottom word line.

16. The phase change memory unit of claim 15, further comprising a first MOS transistor and a second MOS transistor, wherein the top word line is electrically connected to the source/drain of the first MOS transistor and the bottom word line is electrically connected to the source/drain of the second MOS transistor.

17. The phase change memory unit of claim 16, further comprising a first through-silicon via electrically connected to the top word line and source/drain of the first MOS transistor, and a second through-silicon via electrically connected to the bottom word line and source/drain of the second MOS transistor.

* * * * *